US008369978B2

(12) United States Patent
David et al.

(10) Patent No.: US 8,369,978 B2
(45) Date of Patent: Feb. 5, 2013

(54) ADJUSTING POLISHING RATES BY USING SPECTROGRAPHIC MONITORING OF A SUBSTRATE DURING PROCESSING

(75) Inventors: Jeffrey Drue David, San Jose, CA (US); Dominic J. Benvegnu, La Honda, CA (US); Harry Q. Lee, Los Altos, CA (US); Boguslaw A. Swedek, Cupertino, CA (US)

(73) Assignee: Applied Materials, Santa Clara, CA (US)

( * ) Notice: Subject to any disclaimer, the term of this patent is extended or adjusted under 35 U.S.C. 154(b) by 362 days.

(21) Appl. No.: 12/553,870

(22) Filed: Sep. 3, 2009

(65) Prior Publication Data
US 2010/0056023 A1 Mar. 4, 2010

Related U.S. Application Data

(60) Provisional application No. 61/094,379, filed on Sep. 4, 2008.

(51) Int. Cl.
*G06F 19/00* (2011.01)
*B24B 49/00* (2012.01)
*H01L 21/00* (2006.01)
*H01L 21/302* (2006.01)
*G01N 21/00* (2006.01)
*G01B 11/28* (2006.01)
*G01B 11/02* (2006.01)

(52) U.S. Cl. ........ 700/121; 700/109; 700/164; 700/175; 451/5; 451/6; 438/8; 438/689; 438/692; 356/73; 356/630; 356/635

(58) Field of Classification Search ................. 451/5, 6; 356/73, 630, 635–636; 438/8, 689, 692; 700/109, 121, 164, 175
See application file for complete search history.

(56) References Cited

U.S. PATENT DOCUMENTS

| 5,486,129 | A | 1/1996 | Sandhu et al. |
| 6,111,634 | A * | 8/2000 | Pecen et al. ..................... 356/72 |
| 6,464,563 | B1 | 10/2002 | Lensing |
| 6,491,569 | B2 * | 12/2002 | Bibby et al. ...................... 451/6 |
| 7,018,271 | B2 | 3/2006 | Wiswesser et al. |
| 7,097,537 | B1 | 8/2006 | David et al. |
| 7,409,260 | B2 * | 8/2008 | David et al. .................. 700/160 |
| 2002/0001862 | A1 | 1/2002 | Ushio et al. |
| 2002/0155788 | A1 * | 10/2002 | Bibby et al. ...................... 451/6 |
| 2003/0184732 | A1 * | 10/2003 | Katz et al. ....................... 356/72 |
| 2005/0211377 | A1 | 9/2005 | Chen et al. |
| 2007/0039925 | A1 | 2/2007 | Swedek et al. |
| 2007/0042675 | A1 | 2/2007 | Swedek et al. |
| 2007/0224915 | A1 * | 9/2007 | David et al. ...................... 451/5 |
| 2008/0146120 | A1 * | 6/2008 | Ravid et al. ...................... 451/6 |
| 2008/0206993 | A1 | 8/2008 | Lee et al. |
| 2010/0103422 | A1 | 4/2010 | David et al. |
| 2010/0105228 | A1 | 4/2010 | Lai et al. |
| 2010/0217430 | A1 * | 8/2010 | David et al. .................. 700/160 |

OTHER PUBLICATIONS

Applied Materials, Inc., International Search Report and the Written Opinion of the PCT Application No. PCT/US2009/055935 dated Mar. 30, 2010, 12 pages.

* cited by examiner

*Primary Examiner* — Ryan A. Jarrett
*Assistant Examiner* — Darrin Dunn
(74) *Attorney, Agent, or Firm* — Fish & Richardson P.C.

(57) ABSTRACT

A computer-implemented method includes receiving a sequence of current spectra of reflected light from a substrate; comparing each current spectrum from the sequence of current spectra to a plurality of reference spectra from a reference spectra library to generate a sequence of best-match reference spectra; determining a goodness of fit for the sequence of best-match reference spectra; and determining at least one of whether to adjust a polishing rate or an adjustment for the polishing rate, based on the goodness of fit.

16 Claims, 8 Drawing Sheets

ADJUSTING POLISHING RATES BY USING SPECTROGRAPHIC MONITORING OF A SUBSTRATE DURING PROCESSING

CROSS-REFERENCE TO RELATED APPLICATIONS

This application claims priority to U.S. Provisional Application Ser. No. 61/094,379, filed on Sep. 4, 2008.

BACKGROUND

The present invention relates generally to spectrographic monitoring of a substrate during chemical mechanical polishing.

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing disk pad or belt pad. The polishing pad can be either a standard pad or a fixed abrasive pad. A standard pad has a durable roughened surface, whereas a fixed-abrasive pad has abrasive particles held in a containment media. The carrier head provides a controllable load on the substrate to push it against the polishing pad. A polishing liquid, such as a slurry with abrasive particles, is typically supplied to the surface of the polishing pad.

One problem in CMP is using an appropriate polishing rate to achieve a desirable wafer profile, e.g., a wafer that includes a substrate layer that has been planarized to a desired flatness or thickness, or a desired amount of material has been removed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. More generally, an actual polishing rate can be different from an expected polishing rate. Therefore, the polishing endpoint cannot be determined merely as a function of the polishing time.

SUMMARY

In general, one aspect of the subject matter described in this specification can be embodied in a computer-implemented method that includes receiving a sequence of current spectra of reflected light from a substrate. Each current spectrum from the sequence of current spectra can be compared to a plurality of reference spectra from a reference spectra library to generate a sequence of best-match reference spectra. A goodness of fit can be determined for the sequence of best-match reference spectra, and at least one of whether to adjust a polishing rate or an adjustment for the polishing rate can be determined, based on the goodness of fit. Other embodiments of this aspect include corresponding systems, apparatus, and computer program products.

These and other embodiments can optionally include one or more of the following features. The goodness of fit can be less than or equal to a threshold value and the polishing rate can be adjusted. The goodness of fit can be greater than a threshold value and the polishing rate can be maintained. The method can further include modifying a pressure in a carrier head using the adjustment for the polishing rate.

The sequence of current spectra can include spectra from a plurality of radial zones on the substrate, and generating a sequence of best-match reference spectra can include generating a plurality of sequences of best-match reference spectra, each zone having an associated sequence of best-match reference spectra. Determining an adjustment can include calculating a polishing rate for each particular zone based on the best-match reference spectra from the sequence of current spectra associated with the particular zone.

In addition, determining an adjustment can include calculating a modified polishing rate for at least one zone such that the entire substrate reaches a target thickness at approximately the same time. Determining an adjustment can further include calculating a modified polishing parameter to provide the modified polishing rate, and the method can further include adjusting the polishing rate by modifying the polishing parameter.

Determining the goodness of fit can include determining a sequence of indices from the reference spectra library that corresponds to the sequence of best-match reference spectra, and fitting the sequence of indices to a function. The function can produce a line. The goodness of fit can be based on an amount that the sequence of indices varies from the function. The method can further include calculating the amount using a sum of squared differences between the sequence of indices and the function. The method can further include determining a polishing endpoint based on the sequence of best-match reference spectra and the goodness of fit.

In general, another aspect of the subject matter described in this specification can be embodied in a computer-implemented method that includes receiving a sequence of current spectra of reflected light from a substrate. Each current spectrum from the sequence of current spectra can be compared to a first plurality of reference spectra from a first reference spectra library to generate a first sequence of best-match reference spectra. Each current spectrum from the sequence of current spectra can be compared to a second plurality of reference spectra from a second reference spectra library to generate a second sequence of best-match reference spectra. A first goodness of fit for the first sequence of best-match reference spectra and a second goodness of fit for the second sequence of best-match reference spectra can be determined. At least one of whether to adjust a polishing rate or an adjustment for the polishing rate can be determined, based on at least one of the first goodness of fit and the second goodness of fit. Other embodiments of this aspect include corresponding systems, apparatus, and computer program products.

These and other embodiments can optionally include one or more of the following features. At least one of the first goodness of fit and the second goodness of fit can be less than or equal to a threshold value, and the polishing rate can be adjusted. Determining the first goodness of fit can include determining a first sequence of indices from the first reference spectra library that corresponds to the first sequence of best-match reference spectra, and fitting the first sequence of indices to a first function. Determining the second goodness of fit can include determining a second sequence of indices from the second reference spectra library that corresponds to the second sequence of best-match reference spectra, and fitting the second sequence of indices to a second function.

The first function and the second function each can produce a line. The first goodness of fit can be based on a first amount that the first sequence of indices varies from the first function, and the second goodness of fit can be based on a second amount that the second sequence of indices varies from the second function. The method can further include calculating the first amount using a sum of squared differences between the first sequence of indices and the first function, and calculating the second amount using a sum of squared differences between the second sequence of indices and the second function. The method can further include determining a polishing endpoint based on at least one of the first sequence of best-match reference spectra and the first goodness of fit, and the second sequence of best-match reference spectra and the second goodness of fit.

In general, another aspect of the subject matter described in this specification can be embodied in a controller that includes a comparison module that compares each current spectrum from a sequence of current spectra of reflected light from a substrate to a plurality of reference spectra from one or more reference spectra libraries to generate a sequence of best-match reference spectra, and determines a goodness of fit for the sequence of best-match reference spectra. The controller can also include an adjustment module that determines at least one of whether to adjust a polishing rate or an adjustment for the polishing rate, based on the goodness of fit. Other embodiments of this aspect include corresponding systems, methods, and computer program products.

In general, another aspect of the subject matter described in this specification can be embodied in a system that includes a light source, a detector that detects light reflected from the substrate and determines a sequence of current spectra from the light, and a controller. The controller can include a comparison module that compares each current spectrum from the sequence of current spectra to a plurality of reference spectra from one or more reference spectra libraries to generate a sequence of best-match reference spectra, and determines a goodness of fit for the sequence of best-match reference spectra; and an adjustment module that determines at least one of whether to adjust a polishing rate or an adjustment for the polishing rate, based on the goodness of fit. Other embodiments of this aspect include corresponding methods, apparatus, and computer program products.

As used in the instant specification, the term substrate can include, for example, a product substrate (e.g., which can include multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Possible advantages of implementations of the invention can include the following. The polishing process can be less sensitive to noise, disturbances, and other variations, and thus the reliability of the polishing process using an appropriate polishing rate can be improved. As a result, the accuracy and/or precision of polishing an individual wafer to a desired thickness and wafer to wafer uniformity can be improved.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
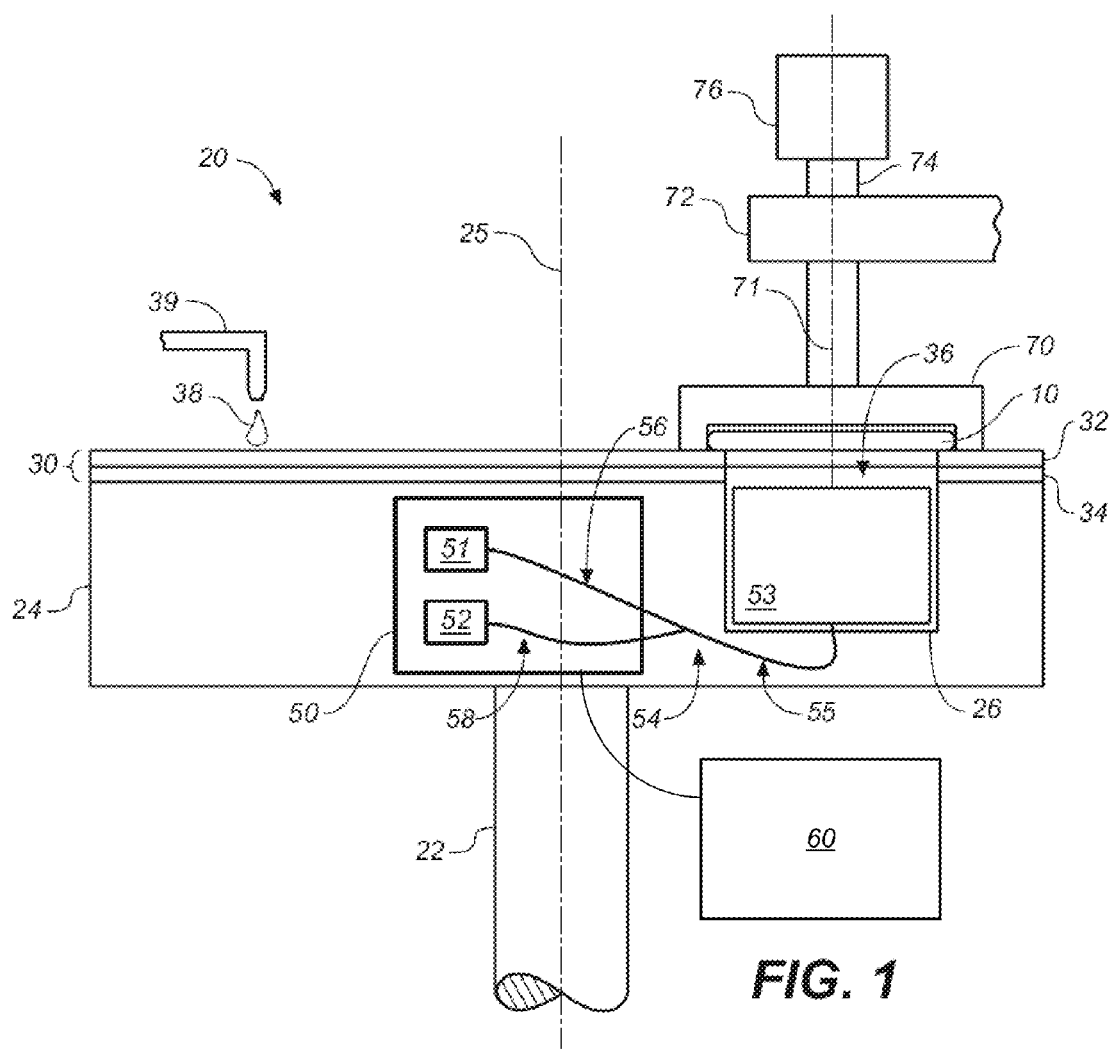
FIG. 1 illustrates an example of a polishing apparatus.

FIG. 1 illustrates an example of a polishing apparatus 20. The polishing apparatus 20 includes a rotatable disk-shaped platen 24, on which a polishing pad 30 is situated. The platen is operable to rotate about an axis 25. For example, a motor can turn a drive shaft 22 to rotate the platen 24.

An optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished. The optical head is further described below.

The polishing apparatus 20 includes a combined slurry/rinse arm 39. During polishing, the arm 39 is operable to dispense a polishing liquid 38, such as a slurry. Alternatively, the polishing apparatus includes a slurry port operable to dispense slurry onto the polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine whether to adjust a polishing rate or an adjustment for the polishing rate as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54. Alternatively, the optical head 53 can merely hold the end of the trunk 55 adjacent the solid window in the polishing pad.

The platen includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to a controller 60, such as a computer, for the optical monitoring system. Similarly, the light source can be turned on or off in response to control commands in digital electronic signals that pass from the controller through the rotary coupler to the module 50.

The in-situ monitoring module can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

The light source 51 is operable to emit white light. In one implementation, the white light emitted includes light having wavelengths of 200-800 nanometers. A suitable light source is a xenon lamp or a xenon mercury lamp.

The light detector 52 can be a spectrometer. A spectrometer is basically an optical instrument for measuring intensity of light over a portion of the electromagnetic spectrum. A suitable spectrometer is a grating spectrometer. Typical output for a spectrometer is the intensity of the light as a function of wavelength (or frequency).

The light source 51 and light detector 52 are connected to a computing device, e.g., the controller 60, operable to control their operation and to receive their signals. The computing device can include a microprocessor situated near the polishing apparatus, e.g., a personal computer. With respect to control, the computing device can, for example, synchronize activation of the light source 51 with the rotation of the platen 24.

Figure 2:
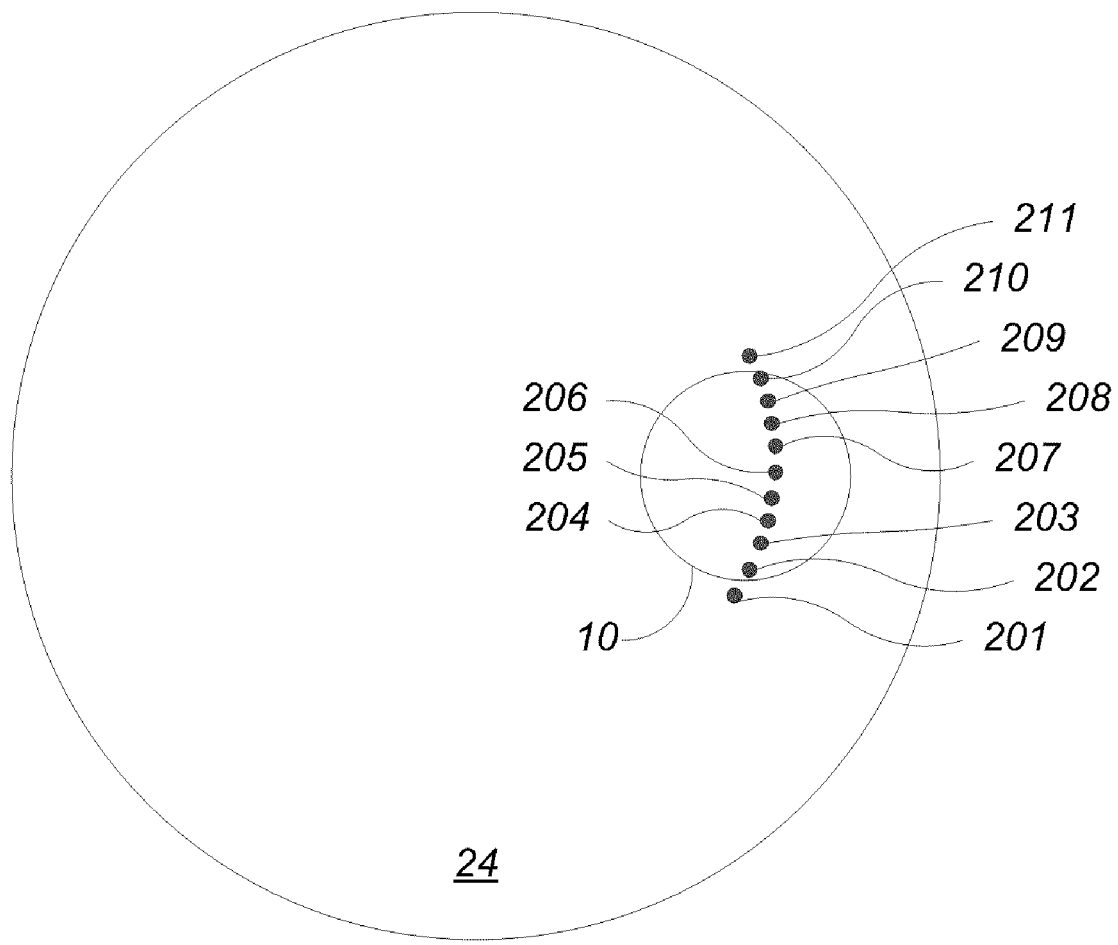
FIG. 2 is an overhead view of an example rotating platen and illustrates locations where in situ measurements can be taken.

As shown in FIG. 2, as the platen rotates, the computing device can cause the light source 51 to emit a series of flashes starting just before and ending just after the substrate 10 passes over the in-situ monitoring module (each of points 201-211 depicted represents a location where light from the in-situ monitoring module impinged and reflected off.) Alternatively, the computing device can cause the light source 51 to emit light continuously starting just before and ending just after the substrate 10 passes over the in-situ monitoring module. In either case, the signal from the detector can be integrated over a sampling period to generate spectra measurements at a sampling frequency. Although not shown, each time the substrate 10 passes over the monitoring module, the alignment of the substrate with the monitoring module can be different than in the previous pass. Over one rotation of the platen, spectra are obtained from different radii on the substrate. That is, some spectra are obtained from locations closer to the center of the substrate and some are closer to the edge. In addition, over multiple rotations of the platen, a sequence of spectra can be obtained over time.

In operation, the computing device can receive, for example, a signal that carries information describing a spectrum of the light received by the light detector 52 for a particular flash of the light source or time frame of the detector. Thus, this spectrum is a spectrum measured in-situ during polishing.

Without being limited to any particular theory, the spectrum of light reflected from the substrate 10 evolves as polishing progresses due to changes in the thickness of the outermost layer, thus yielding a sequence of time-varying spectra. Moreover, particular spectra are exhibited by particular thicknesses of the layer stack.

The computing device can process the signal to determine at least one of whether to adjust a polishing rate or an adjustment for the polishing rate. In particular, the computing device can execute logic that determines, based a goodness of fit (as will be described in further detail below), whether to adjust the polishing rate or the adjustment for the polishing rate.

In some implementations, the computing device can include a comparison module that compares the measured spectra to multiple reference spectra to generate a sequence of best-match reference spectra, and determines a goodness of fit for the sequence of best-match reference spectra. The computing device can also include an adjustment module that determines an at least one of whether to adjust a polishing rate or an adjustment for the polishing rate, based on the goodness of fit.

As used herein, a reference spectrum is a predefined spectrum generated prior to polishing of the substrate. A reference spectrum can have a pre-defined association, i.e., defined prior to the polishing operation, with a value of a substrate property, such as a thickness of the outermost layer. Alternatively or in addition, the reference spectrum can have a pre-defined association with value representing a time in the polishing process at which the spectrum is expected to appear, assuming that the actual polishing rate follows an expected polishing rate.

A reference spectrum can be generated empirically, e.g., by measuring the spectrum from a test substrate having a known layer thicknesses, or generated from theory. For example, to determine a reference spectrum, a spectrum of a "set-up" substrate with the same pattern as the product substrate can be measured pre-polish at a metrology station. A substrate property, e.g., the thickness of the outermost layer, can be also be measured pre-polish with the same metrology station or a different metrology station. The set-up substrate is then polished while spectra are collected. For each spectrum, a value is recorded representing the time in the polishing process at which the spectrum was collected. For example, the value can be an elapsed time, or a number of platen rotations. The substrate can be overpolished, i.e., polished past a desired thickness, so that the spectrum of the light that reflected from the substrate when the target thickness is achieved can be obtained. The spectrum and property, e.g., thickness of the outermost layer, of the set-up substrate can then be measured post-polish at a metrology station.

Optionally, the set-up substrate can be removed periodically from the polishing system, and its properties and/or spectrum measured at a metrology station, before being returned to polishing. A value can also be recorded representing the time in the polishing process at which the spectrum is measured at the metrology station.

The reference spectra are stored in a library. The reference spectra in the library represent substrates with a variety of different thicknesses in the outer layer.

Multiple libraries can be created from different set-up substrates that differ in characteristics other than the thickness of the outermost layer, e.g., that differ in underlying layer thickness, underlying layer pattern, or outer or underlying layer composition.

The measured thicknesses and the collected spectra are used to select, from among the collected spectra, one or more spectra determined to be exhibited by the substrate when it had a thickness of interest. In particular, linear interpolation can be performed using the measured pre polish film thickness and post polish substrate thicknesses (or other thicknesses measured at the metrology station) to determine the time and corresponding spectrum exhibited when the target thickness was achieved. The spectrum or spectra determined to be exhibited when the target thickness was achieved are designated to be the target spectrum or target spectra.

In addition, assuming a uniform polishing rate, a thickness of the outermost layer can be calculated for each spectrum collected in-situ using linear interpolation between the measured pre polish film thickness and post polish substrate thicknesses (or other thicknesses measured at the metrology station) based on the time at which the spectrum was collected. and time entries of the measured spectra.

In addition to being determined empirically, some or all of the reference spectra can be calculated from theory, e.g., using an optical model of the substrate layers. For example, and optical model can be used to calculate a spectrum for a given outer layer thickness D. A value representing the time in the polishing process at which the spectrum would be collected can be calculated, e.g., by assuming that the outer layer is removed at a uniform polishing rate. For example, the time Ts for a particular spectrum can be calculated simply by assuming a starting thickness D0 and uniform polishing rate R (Ts=(D0−D)/R). As another example, linear interpolation between measurement times T1, T2 for the pre-polish and post-polish thicknesses D1, D2 (or other thicknesses measured at the metrology station) based on the thickness D used for the optical model can be performed (Ts=T2−T1*(D1−D)/(D1−D2)).

As used herein, a library of reference spectra is a collection of reference spectra which represent substrates that share a property in common (other than outer layer thickness). However, the property shared in common in a single library may vary across multiple libraries of reference spectra. For example, two different libraries can include reference spectra that represent substrates with two different underlying thicknesses.

Spectra for different libraries can be generated by polishing multiple "set-up" substrates with different substrate properties (e.g., underlying layer thicknesses, or layer composition) and collecting spectra as discussed above; the spectra from one set-up substrate can provide a first library and the spectra from another substrate with a different underlying layer thickness can provide a second library. Alternatively or in addition, reference spectra for different libraries can be calculated from theory, e.g., spectra for a first library can be calculated using the optical model with the underlying layer having a first thickness, and spectra for a second library can be calculated using the optical model with the underlying layer having a different one thickness.

In some implementations, each reference spectrum is assigned an index value. This index can be the value representing the time in the polishing process at which the reference spectrum is expected to be observed. The spectra can be indexed so that each spectrum in a particular library has a unique index value. The indexing can be implemented so that the index values are sequenced in an order in which the spectra were measured. An index value can be selected to change monotonically, e.g., increase or decrease, as polishing progresses. In particular, the index values of the reference spectra can be selected so that they form a linear function of time or number of platen rotations. For example, the index values can be proportional to a number of platen rotations. Thus, each index number can be a whole number, and the index number can represent the expected platen rotation at which the associated spectrum would appear.

The reference spectra and their associated indices can be stored in a library. The library can be implemented in memory of the computing device of the polishing apparatus. The index of the target spectrum can be designated as a target index.

During polishing, an index trace can be generated for each library. Each index trace includes a sequence of indices that form the trace, each particular index of the sequence associated with a particular measured spectrum. For the index trace of a given library, a particular index in the sequence is generated by selecting the index of the reference spectrum from the given library that is the closest fit to a particular measured spectrum.

Figure 3:
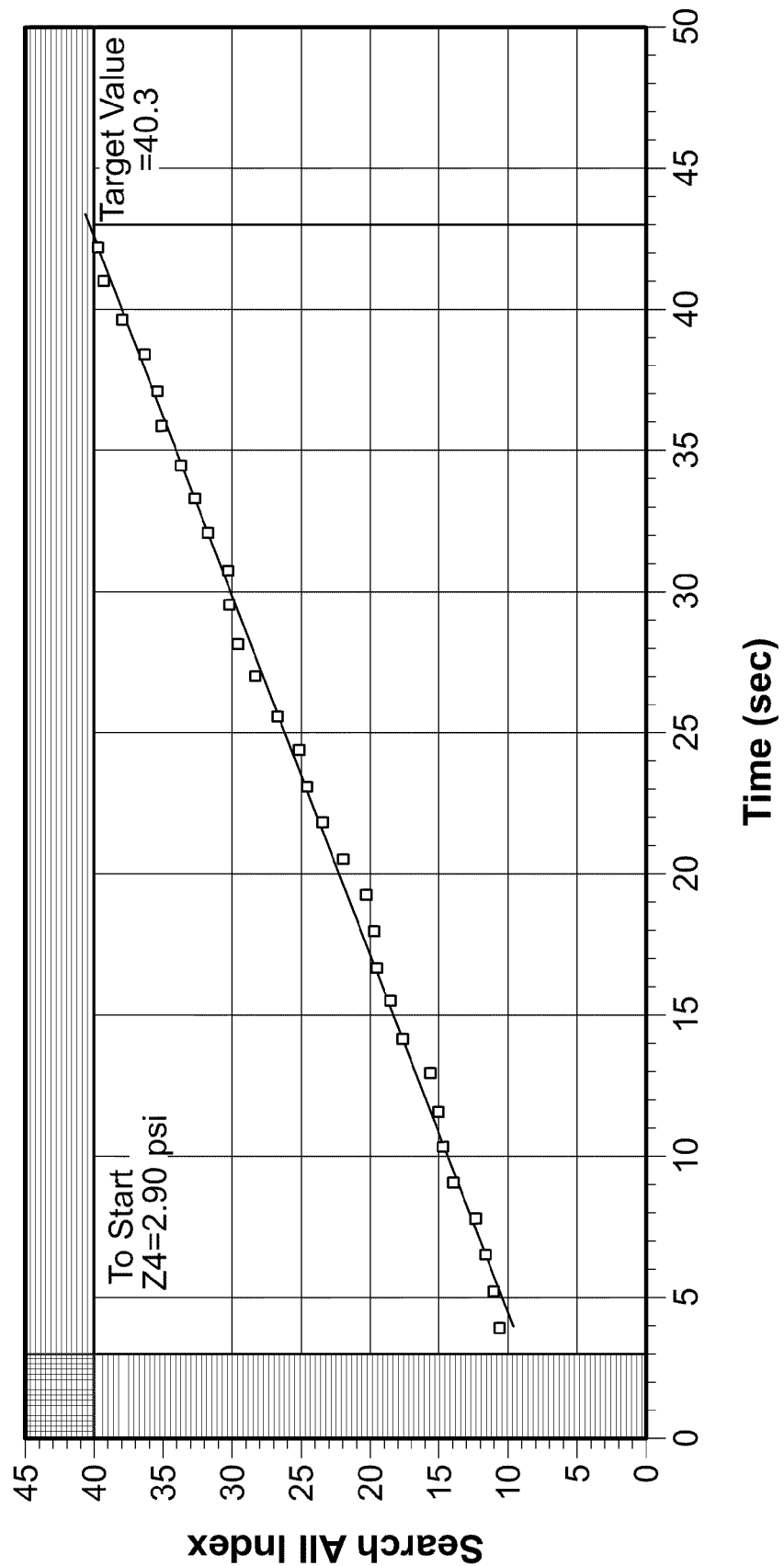
FIG. 3 illustrates an example index trace from a spectrographic monitoring system showing a good data fit.

As shown in FIG. 3, the indices corresponding to each measured spectrum can be plotted according to time or platen rotation. A polynomial function of known order, e.g., a first-order function (i.e., a line) is fit to the plotted index numbers, e.g., using robust line fitting. Where the line meets the target index defines the endpoint time or rotation. For example, a first-order function is fit to the data points as shown in FIG. 3.

Figure 4:
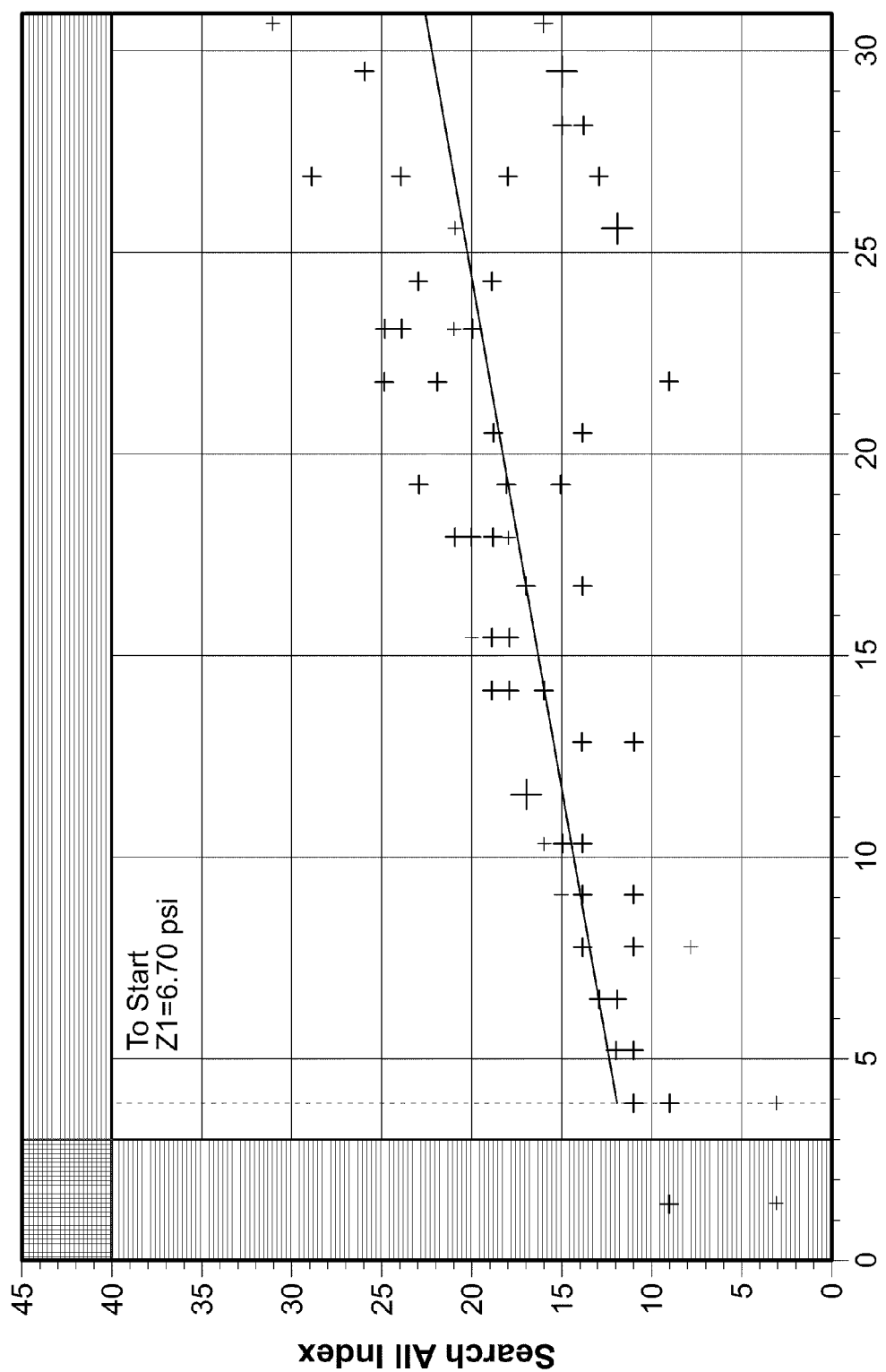
FIG. 4 illustrates an example index trace from a spectrographic monitoring system showing a poorer data fit.

Without being limited to any particular theory, some sequences of indices can match the polynomial function better than others. The goodness of fit (e.g., a value that represents an amount the index trace differs from the polynomial function) can be used to quantify the quality of the match. For example, FIG. 3 illustrates an example index trace from a spectrographic monitoring system showing a good data fit. In comparison, FIG. 4 illustrates an example index trace from a spectrographic monitoring system showing a poorer data fit. In particular, the plotted index numbers in FIG. 4 have a greater amount of difference from an associated robust line, relatively, as compared to the differences from an associated robust line and index trace associated with plotted index numbers in FIG. 3. Quantifying and qualifying the amount of difference from the associated robust line will be described in further detail below.

Because each reference spectrum (and its associated index) can correspond to a layer thickness of the substrate, the poorer fit can indicate that the quality of the signal used to generate the spectra measurements may not be reliable. In some implementations, noise and other disturbances can affect the quality of the signal. For example, noise from the polishing apparatus can introduce variations into the signal. In some implementations, variations in the polishing process can affect the linearity of the index trace. For example, variations in the initial thickness of the substrate layer, the slurry composition, and the polishing pad window condition can result in variation in the reflected spectrum. As a result, measured spectra that are subject to these variations can be matched to incorrect reference spectra. Thus, where a current polishing rate is calculated based on the line fitted sequence of indexes, the calculated current polishing rate may be unreliable, and a decision to adjust the polishing rate based on the current polishing rate may also be unreliable. However, where this improper matching occurs, the fit of the line to the sequence of indexes should be poorer. Thus, adjusting the polishing rate based on the goodness of fit can avoid making an adjustment based on improper matching of the measured spectra to reference spectra, which can increase the accuracy and/or precision of the polishing process.

Figure 5:
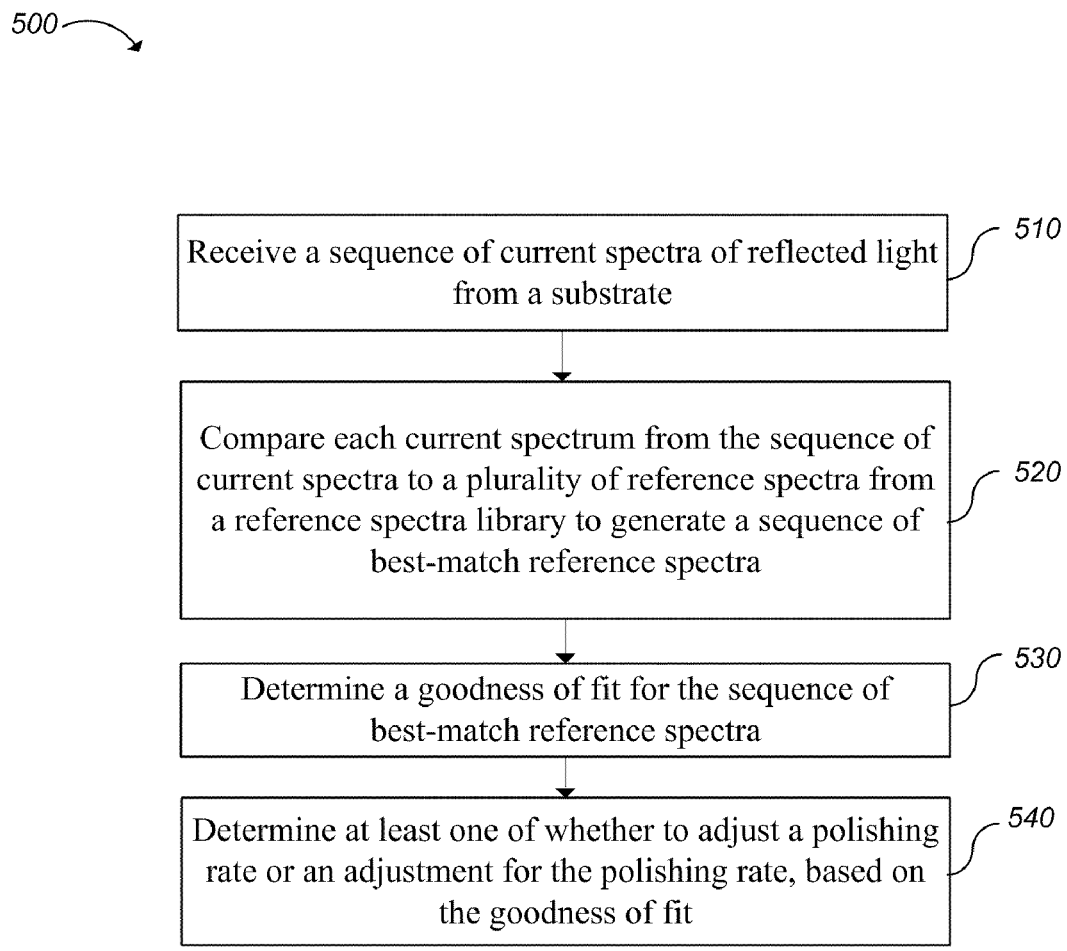
FIG. 5 is a flow diagram of an example process for adjusting a polishing rate.

FIG. 5 is a flow diagram of an example process 500 for adjusting a polishing rate. A sequence of current spectra of reflected light from a substrate is received (step 510). For example, the controller 60 can receive a sequence of current spectra. Each current spectrum from the sequence of current spectra is compared (step 520) to a plurality of reference spectra from a reference spectra library to generate a sequence of best-match reference spectra. More generally, for each current spectrum, the reference spectrum that is the best match to the current spectrum is determined. A goodness of fit is determined (step 530) for the sequence of best-match reference spectra. For example, the sequence of best-match reference spectra can be fit to a line, and a variance from the line can be calculated. At least one of whether to adjust a polishing rate or an adjustment for the polishing rate is determined (step 540), based on the goodness of fit.

Determining an index trace's goodness of fit to a linear function can include determining the amount of difference between the index trace and the associated robust line, e.g., the standard deviation, the correlation, or other measure of variance. For example, a goodness of fit of zero can indicate that all of the index data points fit on the associated robust line, e.g., the variance is zero. In some implementations, the goodness of fit is determined by calculating a sum of squared differences between the index data points and the linear function. Other scales for the goodness of fit are possible.

In some implementations, if the goodness of fit is less than or equal to a threshold value (e.g., indicating the signal is reliable), then the polishing rate can be adjusted. The threshold value can be a user-defined value. Alternatively, if the goodness of fit is greater than the threshold value (e.g., indicating the signal is unreliable), the polishing rate can be maintained.

In addition, an adjustment can be determined based on the goodness of fit. In particular, a lower goodness of fit can indicate a better signal quality, and greater reliability of the spectra measurements. Therefore, in some implementations, the magnitude of the adjustment can be inversely proportional to the goodness of fit. A pressure in a carrier head can be modified using the adjustment for the polishing rate. In some implementations, a polishing endpoint can be determined, based on the sequence of best-match reference spectra and the goodness of fit.

Although only one index trace is discussed above, the concept is applicable to a plurality of index traces. In some implementations, the goodness of fit of can be determined for each of a plurality of index traces generated from a plurality of reference libraries. The concept can be used to determine which reference library to use in order to further determine whether to adjust a polishing rate and an adjustment for the polishing rate. For example, the system can use the reference library that produces the best match to determine whether to adjust a polishing rate or an adjustment for the polishing rate. In particular, if at least one of the index traces has a goodness of fit that is less than or equal to a threshold value, then the polishing rate can adjusted, based on that particular goodness of fit. Alternatively, if none of the index traces has a goodness of fit that is less than or equal to the threshold value, then the polishing rate can be maintained.

Figure 6:
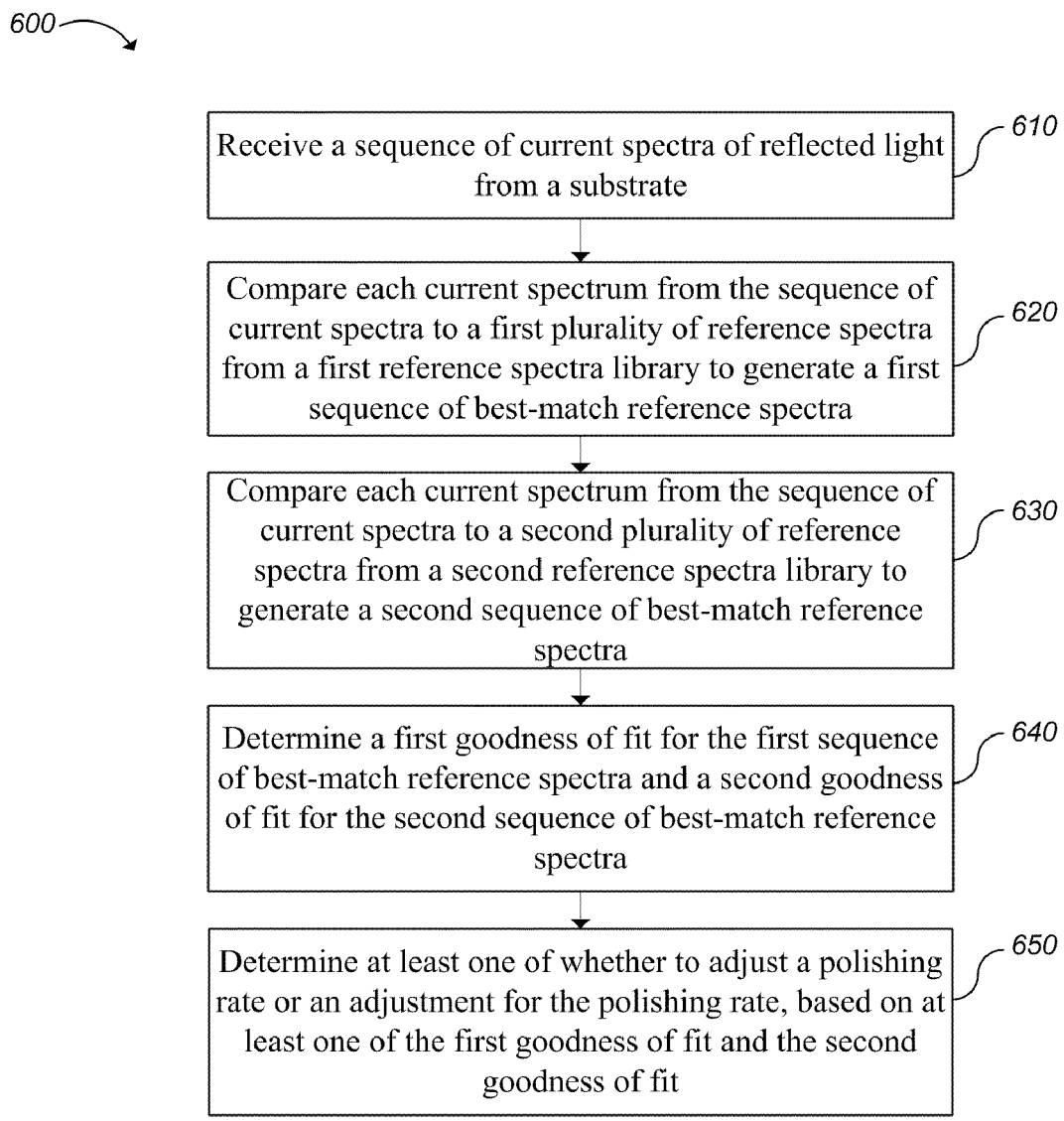
FIG. 6 is a flow diagram of another example process for adjusting a polishing rate.

FIG. 6 is a flow diagram of another example process 600 for adjusting a polishing rate. A sequence of current spectra of reflected light from a substrate is received (step 610). Each current spectrum from the sequence of current spectra is compared (620) to a first plurality of reference spectra from a first reference spectra library to generate a first sequence of best-match reference spectra. Each current spectrum from the sequence of current spectra is compared (630) to a second plurality of reference spectra from a second reference spectra library to generate a second sequence of best-match reference spectra. A first goodness of fit for the first sequence of best-match reference spectra and a second goodness of fit for the second sequence of best-match reference spectra are determined (640). An adjustment for a polishing rate, based on at least one of the first goodness of fit and the second goodness of fit, is determined (650). For example, the first goodness of fit can be compared to the second goodness of fit, and the goodness of fit that indicates a better match can be used to determine the polishing rate.

Determining a difference between each of the current spectra and each of the reference spectra (step 520, 620, or 630) can include calculating the difference as a sum of differences in intensities over a range of wavelengths. That is, $$\text{Difference} = \sum_{\lambda=a}^{b} \text{abs}(I_{current}(\lambda) - I_{reference}(\lambda))$$

where a and b are the lower limit and upper limit of the range of wavelengths of a spectrum, respectively, and $I_{current}(\lambda)$ and $I_{reference}(\lambda)$ are the intensity of a current spectra and the intensity of the reference spectra for a given wavelength, respectively. Alternatively, the difference can be calculated as a mean square error, that is:

$$\text{Difference} = \sum_{\lambda=a}^{b} (I_{current}(\lambda) - I_{reference}(\lambda))^2$$

Where there are multiple current spectra, a best match can be determined between each of the current spectra and each of the reference spectra of a given library. Each selected current spectra is compared against each reference spectra. Given current spectra e, f, and g, and reference spectra E, F, and G, for example, a matching coefficient could be calculated for each of the following combinations of current and reference spectra: e and E, e and F, e and G, f and E, f and F, f and G, g and E, g and F, and g and G. Whichever matching coefficient indicates the best match, e.g., is the smallest, determines the reference spectrum, and thus the index.

Determining the goodness of fit of an index trace associated with a spectra library to the robust line associated with the spectra library (step 530 or 640) may include determining the least sum of squared differences between the data points comprising an index trace and the robust line fitted to the associated with the spectra library. For example, the least sum of squared differences between the data points as represented in FIG. 3 and FIG. 4 and their respective associated robust lines.

In some implementations, a spectrum is obtained at more than one radial position of the substrate. For each spectra measurement, the radial position on the substrate can be determined, and the spectra measurements can be binned into zones based on their radial positions (e.g., radial zones). A substrate can have multiple zones, such as a center zone, a middle zone and an edge zone. For example, on a 300 mm wafer, the center zone can extend from the center to a radius of 50 mm, the middle zone can extend from a radius of 50 mm to about 100 mm and the edge can extend from about 100 mm to about 150 mm. In some implementations, the substrate has more or fewer zones than the three mentioned. The position from which the spectra is obtained can be determined, such as by using the method described in U.S. Pat. No. 7,097,537, or as described in U.S. Pat. No. 7,018,271, incorporated herein by reference for all purposes.

In some implementations, the sequence of current spectra can include spectra from a plurality of radial zones on the substrate. Generating a sequence of best-match reference spectra can include generating a plurality of sequences of best-match reference spectra for each zone. The plurality of sequences of best-match reference spectra can be used to determine at least one of whether to adjust a polishing rate or an adjustment for the polishing rate, based on the goodness of fit. A polishing rate can be calculated for each particular zone based on the best-match reference spectra from the sequence of current spectra associated with the particular zone. In some implementations, a modified polishing rate, for at least one zone, can be calculated such that the entire substrate reaches a target thickness at approximately the same time. A modified polishing parameter can be calculated to provide the modified polishing rage, and the polishing rate can be adjusted by modifying the polishing parameter.

The measured spectra from each zone (or, for each zone, an average of spectra from within the zone obtained from a single sweep of the sensor across the substrate) are compared to the reference spectra in the reference spectra library, as described above, and the corresponding index number is determined for each zone from the comparison with the spectra library. The corresponding index numbers for each zone can be used to generate an index trace, and the index trace can be used to determine a goodness of fit.

Figure 7:
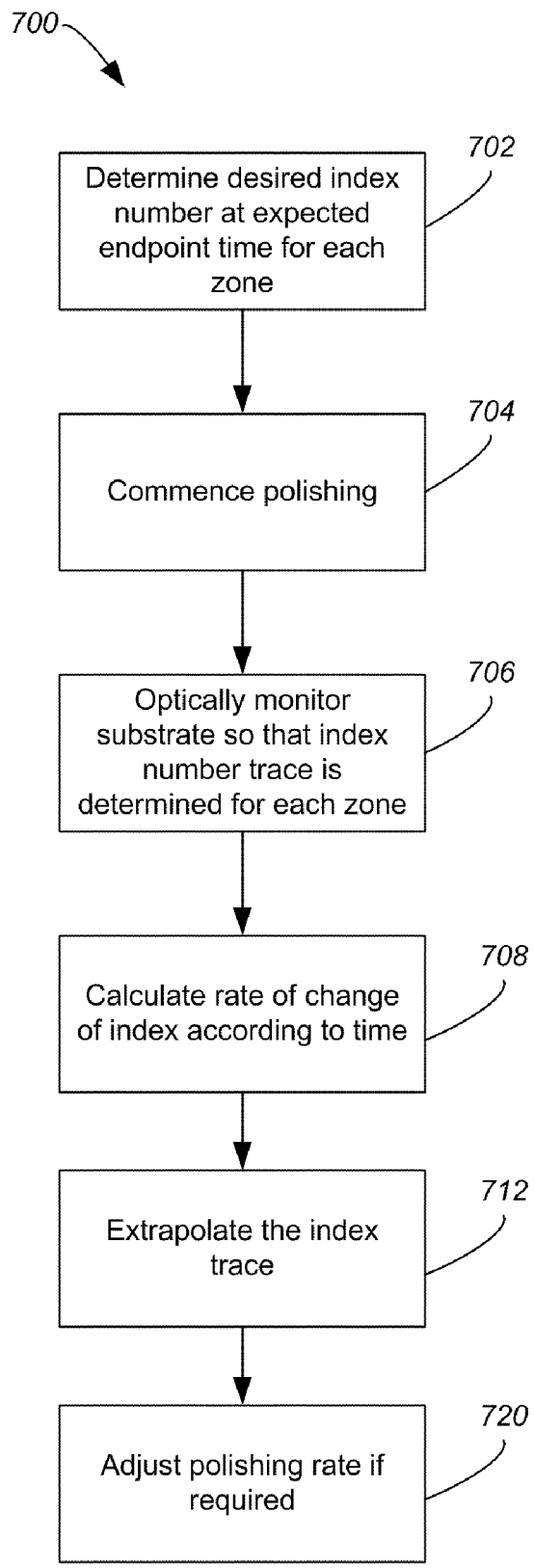
FIG. 7 is a flow diagram of an example process for adjusting the polishing rate in zones to achieve a desired profile.

If the goodness of fit indicates that the spectra measurements are reliable (e.g., the goodness of fit is less than or equal to a threshold value), the polishing rates in the zones can be adjusted using a feedback loop so that the final index number in each zone is equal to the desired final index number. FIG. 7 is a flow diagram of an example process 700 for adjusting the polishing rate in zones to achieve a desired profile. The desired index number at the expected endpoint time is determined for each zone on the substrate (step 702). Polishing commences (step 704) and the substrate is optically monitored as described above so that an index trace is determined for each zone on the substrate (step 706). After an initial delay time, which allows the polishing process to stabilize, the rate of change of the index according to time is calculated (number of platen rotations may be used as representative of the time) (step 708). The rate of change of the index may be calculated simply as a difference in indexes at two different times divided by the number of elapsed platen rotations between the spectra measurements that generated the indexes at the different times. The rate of change in the index number indicates the polishing rate.

The rate of change of the index for each zone is used to extrapolate the index trace to determine the index number that will be achieved at the expected endpoint time for the associated zone (step 712). If at the expected endpoint time, the desired index number will be passed or will not yet been reached and the goodness of fit indicates that the spectra measurements are reliable, the polishing rate can be adjusted upwardly or downwardly, as required (step 720). If the desired index number is reached at the expected endpoint time, no adjustment may be required. More than one extrapolation and determination of whether an adjustment should be made can occur over the polishing sequence. Determining whether an adjustment in the polishing rate is appropriate can include determining whether the goodness of fit indicates that the spectra measurements are reliable, and determining whether the desired index number will be achieved when the polishing endpoint occurs or determining that the final index falls within an acceptable range from the desired final index number.

In some implementations, the expected endpoint time is determined for one zone, such as the center zone. The polishing rates within the other zones are then adjusted, if appropriate, to achieve their desired endpoints at the same time as the expected endpoint time for the selected zone, e.g., the center zone. The polishing rates can be adjusted, such as by increasing or decreasing the pressure in a corresponding zone in the carrier head. In some carrier heads, such as the carrier head described in U.S. Publication No. 2005-0211377, the carrier head has adjustable pressure zones. The change in polishing rate can be assumed to be directly proportional to the change in pressure, e.g., a simple Prestonian model. Additionally, a control model for polishing the substrates can be developed that takes into account the influences of platen or head rotational speed, second order effects of different head pressure combinations, the polishing temperature, slurry flow, or other parameters that affect the polishing rate.

Figure 8:
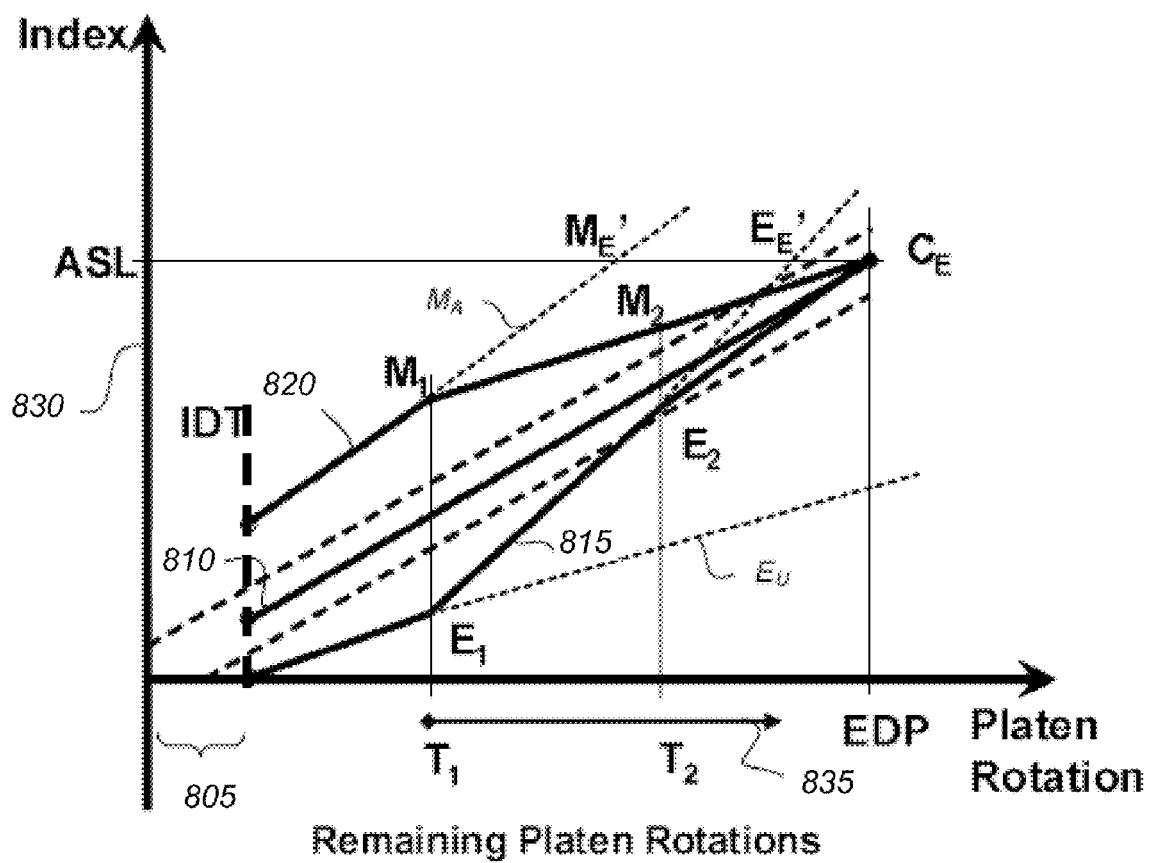
FIG. 8 illustrates an example graph of polishing progress versus time for a process in which the polishing rates are adjusted.

Referring to FIG. 8, if a particular profile is desired, such as a uniform thickness across the surface of the substrate, the slope of the polishing rate, as indicated by the change in index numbers according to time, can be monitored and the polishing rate adjusted if the goodness of fit of the index trace indicates that the spectra measurements are reliable. After a polishing stabilizing period 805, a spectrum is obtained at the center zone 810, at the edge zone 815 and in between at a middle zone 820. Here, the zones are circular or annular zones. Each spectrum is correlated to its respective index. This process is repeated over a number of platen rotations, or over time, and the polishing rate at each of the center zone 810, middle zone 820 and edge zone 815 is determined. The polishing rate is indicated by the slope of the line that is obtained by plotting the index 830 (y-axis) according to the number of rotations 835 (x-axis). If any of the rates is calculated to be faster or slower than the others, the rate in the zone can be adjusted if the goodness of fit of the index trace indicates that the spectra measurements are reliable. Here, the adjustment is based on the endpoint $C_E$ of the center zone 810. For some implementations, if the polishing rates are within an acceptable margin, no adjustment need be made. An approximate polish end point EDP is known from polishing similar substrates with similar polishing parameters or from using the difference method described above. At a first polishing time $T_1$ during the polishing process, the rate of polishing at the middle zone 820 is decreased and the rate of polishing at the edge zone is increased. Without adjusting the polishing rate at the middle zone 820, the middle zone would be polished faster than the rest of the substrate, being polished at an overpolish rate of $M_A$. Without adjusting the polishing rate at $T_1$ for the edge zone 815, the edge zone 815 would be underpolished at a rate of $E_u$.

At a subsequent time ($T_2$) during the polishing process, the rates can again be adjusted, if appropriate. The goal in this polishing process is to end polishing when the substrate has a flat surface, or an oxide layer across the surface that is relatively even. One way of determining the amount to adjust the rate of polishing is to adjust the rates so that the index of each of the center, middle and edge zones are equal at the approximate polish end point EDP. Thus, the polishing rate at the edge zone needs adjusting while the center and middle zones are polished at the same rate as prior to $T_2$. If the EDP is approximate, polishing can be stopped when the index at each zone is in the desired location, that is, when each location has the same index.

During the polishing process, it is preferred to only make changes in the polishing rates a few times, such as four, three, two or only one time. The adjustment can be made near the beginning, at the middle or toward the end of the polishing process. Associating the spectra with an index number creates a linear comparison for polishing at each of the zones and can simplify calculations required to determine how to control the polishing process and obviate complex software or processing steps.

A method that can be applied during the polishing process is to limit the portion of the library that is searched for matching spectra. The library typically includes a wider range of spectra than will be obtained while polishing a substrate. The wider range accounts for spectra obtained from a thicker starting outermost layer and spectra obtained after overpolishing. During substrate polishing, the library searching is limited to a predetermined range of library spectra. In some embodiments, the current rotational index N of a substrate being polished is determined. N can be determined by searching all of the library spectra. For the spectra obtained during a subsequent rotation, the library is searched within a range of freedom of N. That is, if during one rotation the index number is found to be N, during a subsequent rotation which is X rotations later, where the freedom is Y, the range that will be searched from (N+X)−Y to (N+X)+Y. For example, if at the first polishing rotation of a substrate, the matching index is found to be 8 and the freedom is selected to be 5, for spectra obtained during the second rotation, only spectra corresponding to index numbers 9±5 are examined for a match. When this method is applied, the same method can be independently applied to all of the libraries currently being used in the endpoint detection process.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine-readable storage media or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier head, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the actions recited in the claims can be performed in a different order and still achieve desirable results.

What is claimed is:

1. A computer-implemented method comprising:
receiving a sequence of current spectra of reflected light from a substrate;
comparing each current spectrum from the sequence of current spectra to a first plurality of reference spectra from a first reference spectra library, and for each current spectrum from the sequence of spectra determining a first best-match spectrum from the first plurality of reference spectra to generate a first sequence of best-match reference spectra;
comparing each current spectrum from the sequence of current spectra to a second plurality of reference spectra from a second reference spectra library, and for each current spectrum from the sequence of spectra determining a second best-match spectrum from the second plurality of reference spectra to generate a second sequence of best-match reference spectra;
determining a first value associated with each first best-match reference spectrum to generate a first sequence of first values;
determining a second value associated with each second best-match reference spectrum to generate a second sequence of second values;
fitting a first function to the first sequence of first values;
fitting a second function to the second sequence of second values;
determining a first goodness of fit of the first function to the first sequence of first values; and
determining a second goodness of fit of the second function to the second sequence of second values;
comparing at least one of the first goodness of fit and the second goodness of fit to a threshold value; and
determining at least one of whether to adjust a polishing rate or an adjustment for the polishing rate, based on the comparing of the at least one of the first goodness of fit and the second goodness of fit to the threshold value.

2. The method of claim 1, wherein the first goodness of fit and the second goodness of fit are greater than the threshold value and the polishing rate is maintained.

3. The method of claim 1, further comprising:
modifying a pressure in a carrier head based on the adjustment for the polishing rate.

4. The method of claim 1, wherein the sequence of current spectra includes spectra from a plurality of radial zones on the substrate, and generating the first sequence of best-match reference spectra includes generating a plurality of first sequences of best-match reference spectra, each zone of the plurality of radial zones having an associated first sequence of best-match reference spectra, and generating the second sequence of best-match reference spectra includes generating a plurality of second sequences of best-match reference spectra, each zone of the plurality of radial zones having an associated second sequence of best-match reference spectra.

5. The method of claim 4, wherein determining the adjustment includes calculating a polishing rate for each particular zone based on at least one of:
the first sequence of best-match reference spectra associated with the particular zone; and
the second sequence of best-match reference spectra associated with the particular zone.

6. The method of claim 4, wherein determining the adjustment includes calculating a modified polishing rate for at least one zone such that an entirety of the substrate reaches a target thickness at approximately the same time.

7. The method of claim 6, wherein determining the adjustment includes calculating a modified polishing parameter to provide the modified polishing rate, and further comprising adjusting the polishing rate by modifying the polishing parameter.

8. The method of claim 1, wherein determining the first value and fitting the first function includes:
determining a first sequence of values from the first reference spectra library that corresponds to the first sequence of best-match reference spectra; and
fitting the first function to the first sequence of values; and
determining the second value and fitting the second function includes:
determining a second sequence of values from the second reference spectra library that corresponds to the second sequence of best match reference spectra; and
fitting the second function to the second sequence of values.

9. The method of claim 1, wherein at least one of the first goodness of fit and the second goodness of fit is less than or equal to the threshold value, and the polishing rate is adjusted.

10. The method of claim 1, wherein the first function and the second function are each a linear function.

11. The method of claim 1, wherein the first goodness of fit is based on a first amount that the first sequence of first values varies from the first function, and the second goodness of fit is based on a second amount that the second sequence of second values varies from the second function.

12. The method of claim 11, further comprising:
calculating the first amount using a sum of squared differences between the first sequence of values and the first function; and
calculating the second amount using a sum of squared differences between the second sequence of values and the second function.

13. The method of claim 1, further comprising:
determining a polishing endpoint based on at least one of the first sequence of best-match reference spectra and the first goodness of fit; and the second sequence of best-match reference spectra and the second goodness of fit.

14. A controller including a processor, wherein the controller includes:
a comparison module that compares each current spectrum from a sequence of current spectra of reflected light from a substrate to a first plurality of reference spectra from one more a first reference spectra library, and for each current spectrum determines a first best-match spectrum from the first plurality of reference spectra to generate a first sequence of best-match reference spectra, determines a first value associated with each first best-match reference spectrum from the first reference spectra library to generate a first sequence of values, fits a first function to the first sequence of values, and determines a first goodness of fit of the first function to for the first sequence of values, and compares each current spectrum from the sequence of current spectra of reflected light from the substrate to a second plurality of reference spectra from a second reference spectra library, and for each current spectrum determines a second best-match spectrum from the second plurality of reference spectra to generate a second sequence of best-match reference spectra, determines a second value associated with each second best-match reference spectrum from the second reference spectra library to generate a second sequence of values, fits a second function to the second sequence of values, and determines a second goodness of fit of the second function to the second sequence of values; and
an adjustment module that determines at least one of whether to adjust a polishing rate or an adjustment for the polishing rate, based on comparing at least one of the first goodness of fit ant the second goodness of fit to a threshold value.

15. A system comprising:
a light source;
a detector that detects light reflected from the substrate and determines a sequence of current spectra from the light; and
a controller that includes:
a comparison module that compares each current spectrum from a sequence of current spectra of reflected light from a substrate to a first plurality of reference spectra from a first reference spectra library, and for each current spectrum determines a first best-match spectrum from the first plurality of reference spectra to generate a first sequence of best-match reference spectra, determines a first value associated with each first best-match reference spectrum from the first reference spectra library to generate a first sequence of values, fits a first function to the first sequence of values, and determines a first goodness of fit of the first function to the first sequence of values, and compares each current spectrum from the sequence of current spectra of reflected light from the substrate to a second plurality of reference spectra from a second reference spectra library, and for each current spectrum determines a second best-match spectrum from the second plurality of reference spectra to generate a second sequence of best-match reference spectra, determines a second value associated with each second best-match reference spectrum from the second reference spectra library to generate a second sequence of values, fits a second function to the second sequence of values, and determines a second goodness of fit of the second function to the second sequence of values, and an adjustment module that determines at least one of whether to adjust a polishing rate or an adjustment for the polishing rate, based on comparing at least one of the first goodness of fit and the second goodness of fit to a threshold value.

16. A computer program product, encoded in a non-transitory machine-readable storage media, operable to cause data processing apparatus to perform operations comprising:

receiving a sequence of current spectra of reflected light from a substrate;

comparing each current spectrum from the sequence of current spectra to a first plurality of reference spectra from a first reference spectra library, and for each current spectrum determining a first best-match spectrum from the first plurality of reference spectra to generate a first sequence of best-match reference spectra;

comparing each current spectrum from the sequence of current spectra to a second plurality of reference spectra from a second reference spectra library, and for each current spectrum determining a second best-match spectrum from the second plurality of reference spectra to generate a second sequence of best match reference spectra;

determining a first value associated with each first best-match reference spectrum from the sequence of first best-match reference spectra to generate a first sequence of values;

determining a second value associated with each second best-match reference spectrum from the sequence of second best-match reference spectra to generate a second sequence of values;

fitting a first function to the first sequence of values;

fitting a second function to the second sequence of values;

determining a first goodness of fit of the first function to the first sequence of the values;

determining a second goodness of fit of the second function to the second sequence of the values;

comparing at least one of the first goodness of fit and the second goodness of fit to a threshold value; and determining at least one of whether to adjust a polishing rate or an adjustment for the polishing rate, based on the comparing of at least one of the first goodness of fit and the second goodness of fit to the threshold value.

* * * * *

UNITED STATES PATENT AND TRADEMARK OFFICE
CERTIFICATE OF CORRECTION

PATENT NO. : 8,369,978 B2
APPLICATION NO. : 12/553870
DATED : February 5, 2013
INVENTOR(S) : Jeffrey Drue David Page 1 of 1

It is certified that error appears in the above-identified patent and that said Letters Patent is hereby corrected as shown below:

In the Claims:

In Claim 1, line 7 (column 14, line 40), after "of" insert -- current --.
In Claim 1, line 14 (column 14, line 47), after "of" insert -- current --.
In Claim 14, line 6 (column 16, line 12), delete "one more".
In Claim 14, line 14 (column 16, line 20), after "to" delete "for".
In Claim 14, line 31 (column 16, line 37), change "ant" to -- and --.

Signed and Sealed this
Seventh Day of May, 2013

Teresa Stanek Rea
*Acting Director of the United States Patent and Trademark Office*